United States Patent [19]
Hart et al.

[11] Patent Number: 5,293,331
[45] Date of Patent: Mar. 8, 1994

[54] HIGH DENSITY EEPROM CELL WITH TUNNEL OXIDE STRIPE

[75] Inventors: Michael J. Hart, Palo Alto; Albert Bergemont, Santa Clara, both of Calif.

[73] Assignee: National Semiconductor Corporation, Santa Clara, Calif.

[21] Appl. No.: 891,764

[22] Filed: Jun. 1, 1992

[51] Int. Cl.$^5$ ............................................. G11C 11/34
[52] U.S. Cl. ................................... 365/185; 257/321; 257/315; 257/346
[58] Field of Search ............... 365/185; 257/321, 389, 257/346, 366, 381, 312, 313, 314, 315, 316, 317

[56] References Cited

U.S. PATENT DOCUMENTS

| | | | |
|---|---|---|---|
| 4,947,222 | 8/1990 | Gill et al. | 365/185 |
| 4,979,005 | 12/1990 | Mitchell | 257/316 |
| 5,051,796 | 9/1991 | Gill | 365/185 |
| 5,057,886 | 10/1991 | Riemenschneider et al. | 257/321 |
| 5,156,990 | 10/1992 | Mitchell | 257/316 |

FOREIGN PATENT DOCUMENTS

49107   7/1991   Japan ................... 365/185

Primary Examiner—Eugene R. LaRoche
Assistant Examiner—Vu Le

[57] ABSTRACT

An electrically erasable programmable read only memory (EEPROM) cell and fabrication process includes first field oxide regions (FOX1) formed in a P-well in an N-substrate to define a p-type device region. Buried N+ bit lines formed in the substrate adjacent to FOX1 regions define a p-channel region. Second field oxide (FOX2) regions overlying the N+ bit lines. A gate oxide layer is formed on the substrate between the FOX2 regions. A tunnel stripe is then defined in the gate oxide; the gate oxide is etched from the stripe; and a tunnel oxide stripe is grown in the etched stripe. The tunnel oxide stripe extends across a plurality of EEPROM cells sharing common bit lines. A layer of polysilicon is formed extending over the tunnel oxide stripe, thus defining a floating gate for the cell. The intersection of the tunnel oxide stripe and the floating gate defines the tunneling region for each cell. A layer of oxide/nitride/oxide (ONO) composite is formed over the floating gate. A second polysilicon layer and an overlying tungsten silicide are then formed over the ONO to define the control gate.

16 Claims, 5 Drawing Sheets

HIGH DENSITY EEPROM CELL WITH TUNNEL OXIDE STRIPE

RELATED APPLICATIONS

This application is related to the following two applications which are commonly-assigned with this application to National Semiconductor Corporation and are both filed of even date herewith: (1) U.S. patent application Ser. No. 07/891,705, filed by Albert Bergemont for HIGH DENSITY EEPROM CELL WITH NOVEL PROGRAMMING SCHEME AND METHOD OF MANUFACTURE and (2) U.S. patent application Ser. No. 07/891,710, filed by Albert Bergemont for HIGH DENSITY EEPROM CELL WITH POLY TUNNEL SPACER. Both of the aforementioned related applications are hereby incorporated by reference to provide additional background information regarding the present invention.

BACKGROUND OF THE INVENTION

1. Field of the Invention

The present invention relates to high density electrically erasable programmable read only memory (EEPROM) devices and, in particular, to an EEPROM cell that is fabricated over a P-well and wherein the tunnel oxide region is formed as a stripe rather than as a window.

2. Discussion of the Prior Art

The basic, fundamental challenge in creating an electrically erasable programmable read only memory (EEPROM) cell is to use a controllable and reproducible electrical effect which has enough nonlinearity so that the memory cell can be written or erased at one voltage in less than 1 ms and can be read at another voltage, without any change in the programmed data for more than 10 years. Fowler-Nordheim tunneling, which was first described by Fowler and Nordheim in 1928, exhibits the required nonlinearity and has been widely used in EEPROM memories.

In silicon (Si), the energy difference between the conduction band and the valence band is 1.1 eV. In silicon dioxide ($SiO_2$), the energy difference between these bands is about 8.1 eV, with the conduction band in $SiO_2$ 3.2 eV above that in silicon. Since electron energy is about 0.025 eV at thermal room temperature, the probability that an electron in Si can gain enough thermal energy to surmount the Si-to-$SiO_2$ barrier and enter the conduction band in $SiO_2$ is very small. If electrons are placed on a polysilicon floating gate surrounded by $SiO_2$, then this band diagram will by itself insure the retention of data.

Fowler-Nordheim emission, which was observed early in this century for the case of electron emission from metals into vacuums, was also observed by Lenzliger and Snow in 1969 for electron emission from silicon to silicon dioxide. In the presence of a high electric field at the Si-$SiO_2$ interface, the energy bands will be distorted and there is a small, but finite, probability that an electron in the conduction band of the Si will quantum mechanically tunnel through the energy barrier and emerge in the conduction band of the $SiO_2$.

The tunneling current increases exponentially with the applied field in accordance with the following general current density expression:

$$J = (AE^2) \exp(-B/E)$$

where A and B are constants, and
E is the field at the Si-SiO2 interface

This current is observable at a current density of 10E-6 A/cm2 when the field at the Si-$SiO_2$ interface is about 10 MV/cm. Local fields of this magnitude, at voltages practicable for use in microelectronics, can be obtained by applying a voltage across either a thin (about 100 Å,) oxide grown on bulk silicon or across thicker (about 500 Å) oxide grown on polysilicon. In the latter case, the field enhancement arises from textured polysilicon formation, i.e. positive curvature regions at the polysilicon-polysilicon oxide interface resulting in tunneling enhancement at similar voltages as in the first case.

The theoretically ideal EEPROM memory cell comprises a single transistor addressable by applying electrical signals to a specified row and a specified column of the memory array matrix. For example, to write a logic "1" or "0" into this "ideal" cell, a voltage is applied to the control gate corresponding to the row (word line) of the selected memory cell while a voltage corresponding to either a logic "1" or a "0" is applied to the source or drain corresponding to the column (bit line) of the selected cell.

An important problem encountered in attempts to realize this "ideal" cell is the need for an additional access transistor in each memory cell to enable selection of a single row of memory cells while changing data in the selected cell without accidentally writing or erasing memory in other rows. Unfortunately, the presence of an additional access transistor in each memory cell increases the size of the cell and leads to impractical die size for high density Megabit memory arrays.

It is, therefore, a goal to provide an EEPROM cell which does not require an additional distinct access transistor in each memory cell to provide reliable selection of a single cell for changing data while precluding accidental simultaneous programming or erasure in non-selected cells.

Figure 1:
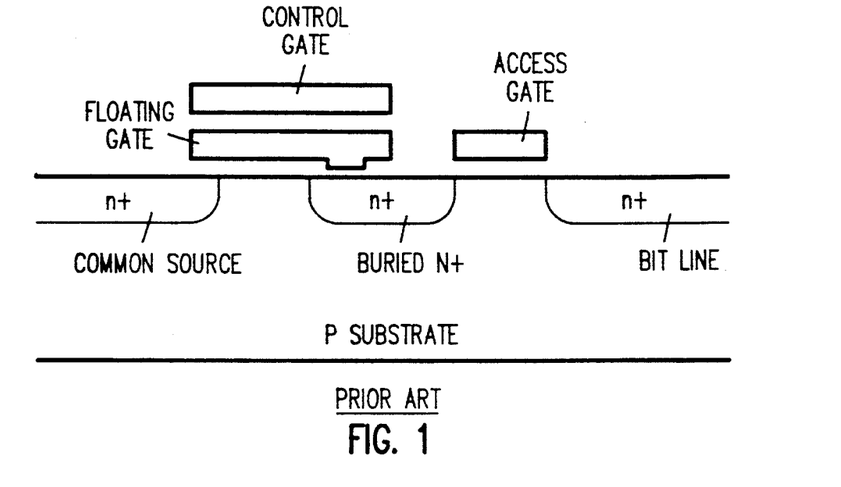
FIG. 1 is a cross-section drawing illustrating a conventional EEPROM cell structure that utilizes a distinct access transistor.

The basic concept of the well-known FLOTOX EEPROM memory cell is shown in FIG. 1. In the FLOTOX cell, the tunnel dielectric, which is typically less than 100 Å thick, is grown over an area defined photolithographically in the drain region (or an extension of the drain region, called buried N+). Charging of the floating gate to program the cell is achieved by grounding the source and the drain and applying a high voltage to the control gate. The cell is designed such that a large fraction of the applied voltage is coupled across the tunnel oxide, resulting in the transport of electrons from the drain to floating gate. Discharge of the floating gate to erase the cell is achieved by grounding the control gate, floating the source and applying a high voltage to the drain. In this case, most of the applied voltage is coupled across the tunnel oxide, but the field is reversed, resulting in tunneling of electrons from the floating gate to the drain. The source is floated so that there is no continuous current path, an important factor when an internal charge pump is used to generate the high voltage from the $\leq 5$ V supply.

If a single transistor memory cell is placed in a typical array with drains connected to metal columns and gates connected to common polysilicon word lines, the erasing of a cell, with the word line grounded, will mean that high voltage is applied to all drains in a common column. Erasing can be inhibited in non-selected cells by taking unselected word lines to a high voltage. However, this means that unselected cells along the same word line may be programmed. To avoid such disturb conditions, as shown in FIG. 1, the FLOTOX cell utilizes a distinct access transistor to isolate the drain from the column bit line. The access transistor is off for rows that are not selected.

Figure 2:
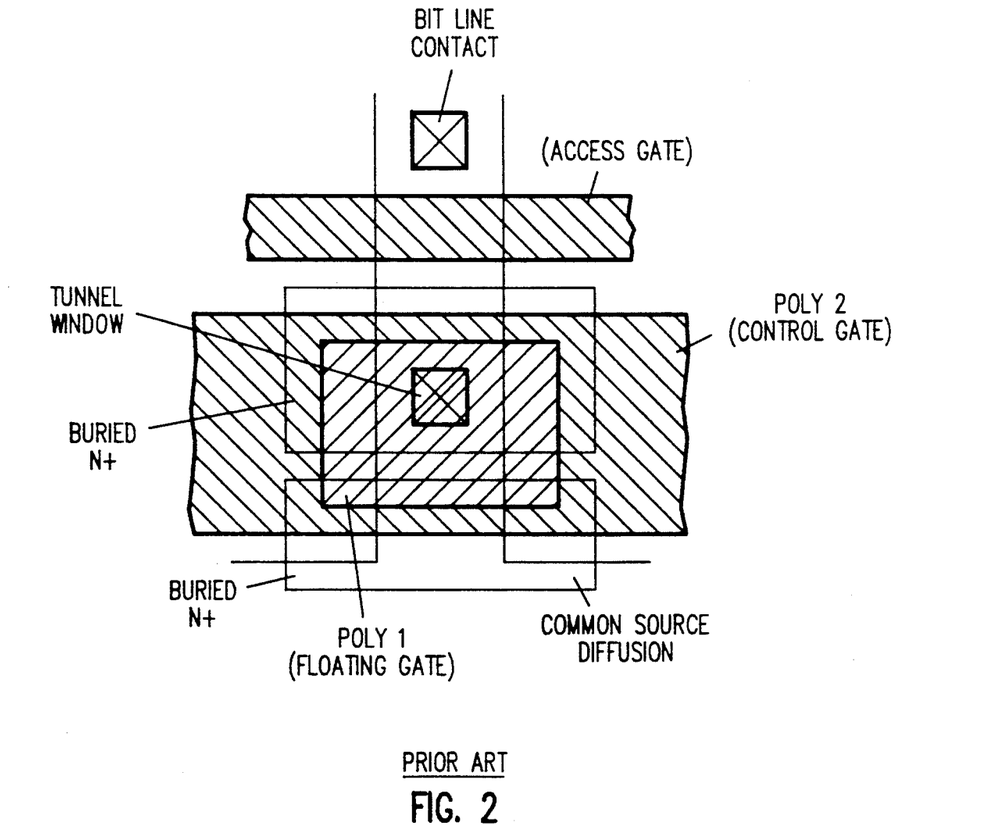
FIG. 2 is a layout illustrating the FIG. 1 cell structure.

FIG. 2 provides a layout of the FIG. 1 FLOTOX cell, with the FIG. 1 cross section being taken perpendicular to the word line (control gate) and through the tunnel oxide window.

Figure 3:
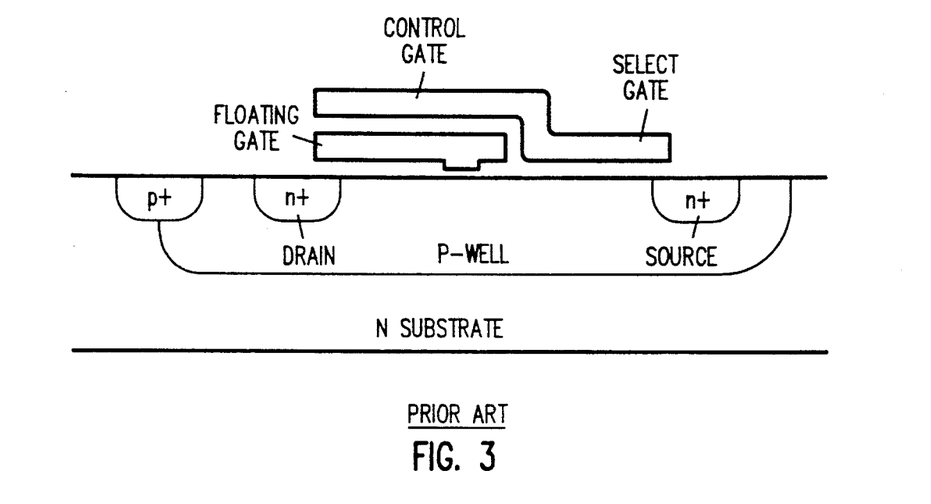
FIG. 3 is a cross-section drawing illustrating a prior art EEPROM cell that is fabricated on a P-well and utilizes an internal access transistor.

E. K. Shelton, "Low-power EE-PROM can be reprogrammed fast", Electronics, Jul. 31, 1980, pp. 89-92, discloses a basic EEPROM concept similar to the above-described FLOTOX concept. However, as shown in FIG. 3, instead of a small tunnel oxide area defined lithographically over the drain (buried N+), the Shelton cell has its tunnelling area defined in the channel under the polysilicon floating gate. The polysilicon floating gate partially spans the drain side of the channel, while the remainder of the channel (source side) is spanned by an overlying aluminum control gate. The aluminum control gate is insulated from the polysilicon floating gate by a thin silicon nitride layer.

Furthermore, the Shelton memory cell is formed in a P-well on a N-substrate. Controlling the P-well potential allows the elimination of the distinct access transistor in each memory cell. The potential of the P-well and the sources and drains of the unselected cells are chosen during programming operations to prevent minority carriers from discharging any of the floating gates to the substrate while permitting an individual selected floating gate to be programmed.

Programming of the FIG. 3 cell is achieved by grounding the P-well and connecting the drain of the memory cell through a load resistance to the programming voltage. The source is connected to either the programming voltage or to ground depending upon whether a "1" or a "0" is to be stored. To initiate programming, the aluminum control gate is connected to the high voltage. If the source potential is also connected to the high voltage, then the transistor doesn't turn on and the surface of the P-well below the floating gate is depleted of electrons. Only a small potential difference exists between the surface of the P-well and the floating gate. Therefore, no electrons tunnel into the gate and the cell remains in a 0 state. If the source terminal is connected to ground (to program a 1), then the transistor turns on, the surface potential under the floating gate drops to close to 0 V, and electrons from the inversion layer tunnel through the tunnel oxide into the floating gate.

The FIG. 3 cell is erased by grounding the control gate and then raising the P-well to the programming voltage. This causes electrons to tunnel from the floating gate to the P-well via the tunnel oxide. As electrons tunnel through the tunnel oxide, the floating gate acquires a net positive charge.

Although the FIG. 3 Shelton cell differs from the FIG. 1 FLOTOX cell in that it does not utilize a distinct access transistor, it does require an internal access transistor and, thus, requires a relatively large cell size.

While both of the above-referenced Bergemont applications disclose high density EEPROM cells that provide significant advantages over the prior art, the EEPROM cells disclosed therein require the formation of a small window to define the cell's tunnel oxide region. Typically, this window is defined at the minimum design rule for the given technology level. Photolithographic control of such a window is critical to operation of the cell, directly effecting the cell's coupling ratio for programming and erase operations and effecting spacing rules within the cell. Furthermore, the wetting and complete etching of the initial gate oxide in photolithographically defining the tunnel oxide window must be controlled very accurately during the window etching process.

SUMMARY OF THE INVENTION

A preferred embodiment of the present invention provides an electrically erasable programmable read only memory (EEPROM) cell that is fabricated by forming first and second first field oxide (FOX1) regions in a P-well in an N-substrate to define a P-type active device region therebetween. Next, first and second buried N+ bit lines are formed in the P-well adjacent to the first and second FOX1 regions, respectively, such that the first and second bit lines define a P-type channel region therebetween. First and second second field oxide (FOX2) regions are then formed adjacent to the first and second FOX1 regions, respectively, and overlying the first and second buried N+ bit lines, respectively. Next, a layer of gate oxide about 300-500 Å thick is formed on the P-well between the first and second FOX2 regions. A tunnel stripe is then defined in the gate oxide, the gate oxide is removed from the tunnel stripe, and tunnel oxide about 80-100 Å thick is grown in the etched stripe. The tunnel oxide stripe extends across a plurality of adjacent EEPROM cells that share the first and second N+ bit lines. After definition of the tunnel oxide stripe, a layer of polysilicon is formed over the gate oxide to extend over the tunnel oxide stripe to define the cell's floating gate. Thus, the tunneling region of each cell sharing common bit lines in the array is defined by the intersection of the tunnel oxide stripe and the floating gate of each such cell. A oxide/nitride/oxide sandwich is then formed over the floating gate. Finally, a second layer of polysilicon and overlying tungsten silicide is formed over the ONO to define the cell's control gate.

Formation of the tunnel oxide stripe is more easily performed than the formation of the conventional minimum geometry tunnel windows. Furthermore, the lithographic definition and etching/wetting problems associated with the prior art are greatly eased.

The resulting cell is significantly smaller than conventional cells. The height of the cell is limited only by the minimum pitch of the word line.

A better understanding of the features and advantages of the present invention will be obtained by reference to the following detailed description of the invention and accompanying drawings which set forth an illustrative embodiment in which the principals of the invention are utilized.

DETAILED DESCRIPTION OF THE INVENTION

FIGS. 4–7 illustrate the steps for fabricating a high density EEPROM cell in accordance with the present invention.

Figure 4:
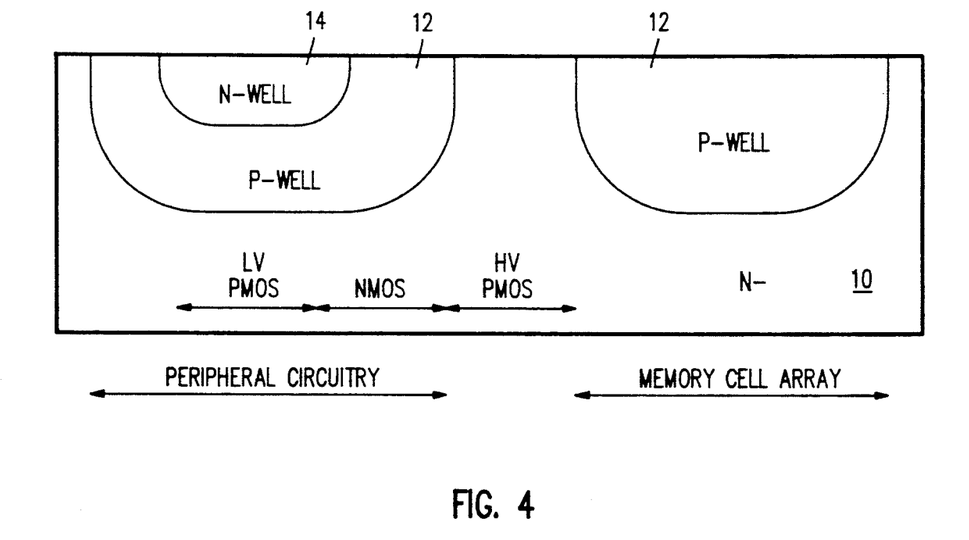
FIG. 4 is a cross-section drawing illustrating a triple-well structure utilizable in the fabrication of a high density EEPROM cell array in accordance with the present invention.

Referring to FIG. 4, the fabrication process begins with a silicon substrate 10 of N-type conductivity. In a conventional front-end process step, an initial oxide layer, (not shown) is grown over the substrate 10. A photoresist mask is then formed over the initial oxide layer and patterned to define selected surface areas of the N-type substrate 10. The exposed surface areas are then implanted with a P-type dopant to form P-well regions 12 in the substrate 10. The photoresist mask is then stripped from the surface of the oxide and a thermal drive-in step is performed to further define the P-well regions 12.

The initial oxide layer is then removed from the substrate 10 and a second oxide layer (not shown) is grown over the substrate 10. The substrate 10 is again masked with photoresist, which is patterned to define substrate surface areas within those P-well regions 12 which will ultimately contain the peripheral circuitry for the EEPROM memory cell array. N-type dopant is implanted into the periphery P-wells 12 to define N-well regions 14. The photoresist is then stripped and a further drive-in step for both the N-well regions 14 and the P-well regions 12 is performed. Following the drive in step, the second oxide layer is removed, resulting in the structure shown in FIG. 4.

Thus, the initial processing steps result in the formation of a triple-well structure which defines the substrate 10 for the formation of the memory cell array and its peripheral circuitry. The N-well regions 14 in the periphery will be utilized for the fabrication of low voltage (LV) PMOS devices. The P-well regions 12 in the periphery will be utilized for the formation of NMOS devices for the peripheral circuitry. The P-well regions 12 in the memory cell array portion of the substrate 10 will be utilized for formation of the EEPROM storage cells. The intermediate substrate region will be used for the formation of high voltage (HV) PMOS devices.

Figure 5:
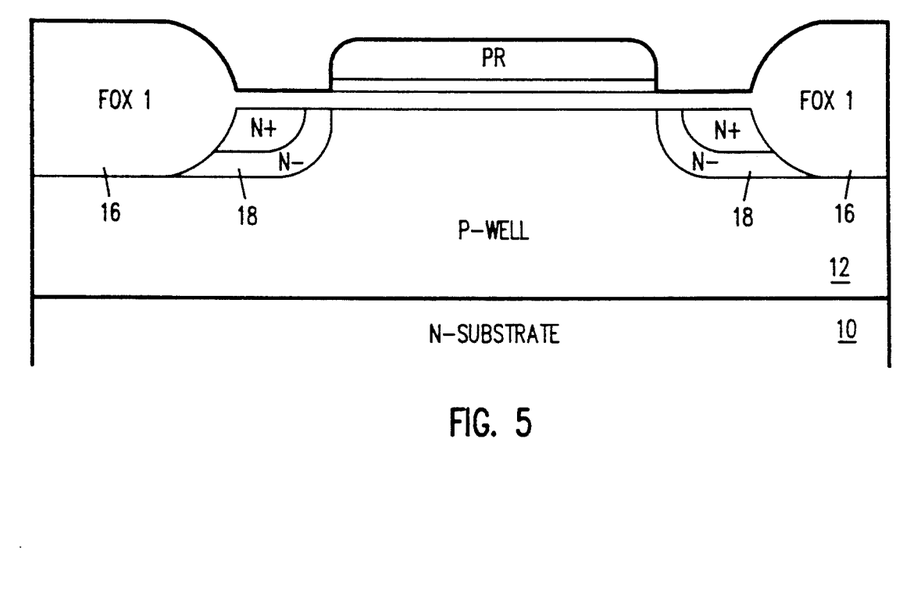
FIGS. 5–7 are cross-section drawings illustrating the fabrication of a high density EEPROM cell in accordance with the present invention.

Referring now to FIG. 5, after formation of the triple-well structure described above, conventional process techniques are utilized to define regions in the substrate 10 for formation of field oxide. That is, a pad oxide is first grown on the surface of the substrate 10, followed by deposition of an overlying nitride layer. The pad oxide/nitride composite on the entire device is masked with photoresist, which is then patterned to expose regions of underlying nitride which will ultimately define first field oxide (FOX1) regions. The nitride is then etched, the photoresist is stripped and a P-type field implant is performed through the exposed pad oxide regions. The field implant mask is then stripped and spaced-apart first field oxide regions (FOX1) 16 are formed, as shown in FIG. 5.

Next, as further shown in FIG. 5, portions of the P-well region 12 in the memory cell array are masked, the nitride/oxide composite is etched, and an arsenic implant is performed to define spaced-apart N+ buried bit lines 18 adjacent the FOX1 field oxide regions 16. Optionally, the arsenic implant can be followed by a phosphorous implant to form graded N+/N− bit lines, thereby optimizing resistance to avalanche breakdown during the erase of the EEPROM cells.

Figure 6:
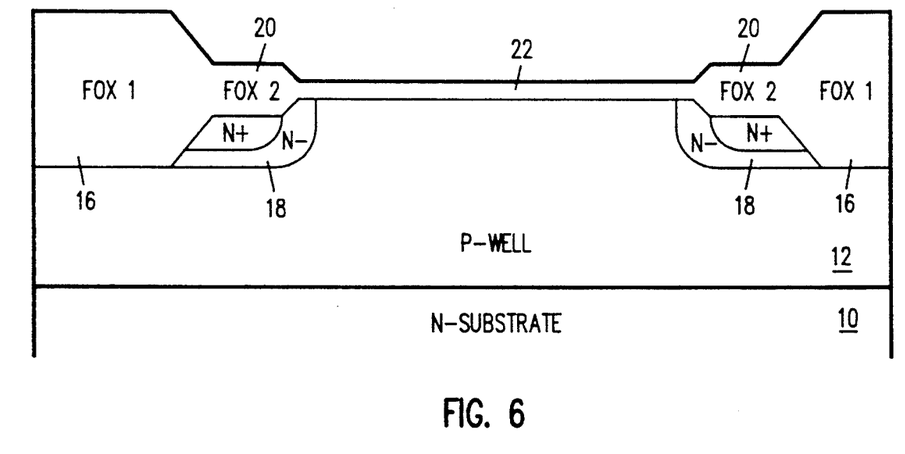

As shown in FIG. 6, the photoresist is then stripped and field oxide growth is completed by formation of second field oxide regions (FOX2) 20 over the N+/N− bit lines 18. Since the bit lines 18 are formed under the field oxide, the size of the device active region can be reduced, resulting in a reduced array size.

After completion of the field oxide growth, i.e. formation of FOX1 regions 16 and FOX2 regions 20, the oxide/nitride/oxide (ONO) layer is removed and a sacrificial oxide layer (not shown) is formed. A threshold voltage mask is then formed and patterned to expose the channel regions of the N-channel devices of the array. A threshold implant is then performed to characterize the threshold voltage of the storage cell transistors and the photoresist mask is stripped. Then the sacrificial oxide is removed.

Next, a gate oxide layer 22 about 300–500 Å thick is grown over the exposed portions of P-well region 12. A tunnel stripe mask is then formed over the gate oxide 22 and patterned to define a tunnel stripe over the P-well 12 and parallel to the buried N+ bit lines 18. The tunnel stripe is then etched through to the surface of the underlying P-well 12. The tunnel mask is then stripped and a tunnel oxide stripe 24 about 80–100 Å thick is grown in the tunnel stripe.

Next, a first layer 26 of polysilicon is deposited on the underlying oxide to a thickness of about 1500 Å and doped with phosphorous. The polysilicon 26 (poly1) serves as the floating gate for the EEPROM cells of the array.

A composite dielectric layer 28 of oxide/nitride/oxide (ONO) is then formed on the poly1 26. After growing this ONO layer 28, a photoresist mask is used to define strips on the ONO. The ONO/poly1 composite is then plasma etched to form parallel lines of ONO/poly1.

After stripping the photoresist from the poly1 mask, a thin edge oxide is grown on the sidewalls of the poly1 lines to provide insulation from subsequently-formed conductive material.

A protect array mask is then formed over the memory cell array portion of the substrate 10 and device formation in the periphery proceeds.

First, oxide is etched from the substrate active device regions in the periphery and gate oxide is grown on the active device regions. A threshold mask is then formed and a P-type implant is performed to set the threshold of the peripheral MOS devices. The threshold photoresist mask is then stripped and processing begins to form both the word lines for the memory cell array and the gates for the MOS devices in the periphery.

That is, a second layer of polysilicon is deposited over the surface of the entire device and doped in the conventional manner. This is followed by deposition of an overlying layer of tungsten silicide. The poly2/tungsten silicide composite is then masked and etched to define the word lines in the storage cell array and the gate electrodes of the peripheral MOS devices, the word lines running parallel to and overlying the ONO/poly1 lines in the array. The poly2 mask is then UV-hardened and a self-aligned etch (SAE) mask is formed.

This is followed by a stacked etch of the poly1 floating gates 26 utilizing the overlying poly2 word lines as a mask for the self-aligned etch of the ONO/poly1 sandwich.

The remaining photoresist is then stripped from the device and a sidewall oxidation step is performed on the devices in the peripheral region and for the poly1/poly2 stack in the array.

From this point, the process flow proceeds according to standard CMOS processing techniques with extra masks utilized for forming the high voltage PMOS transistors in the N-substrate 10 between the periphery and the storage cell array. The resulting cell structure is shown in FIG. 7.

Figure 7:
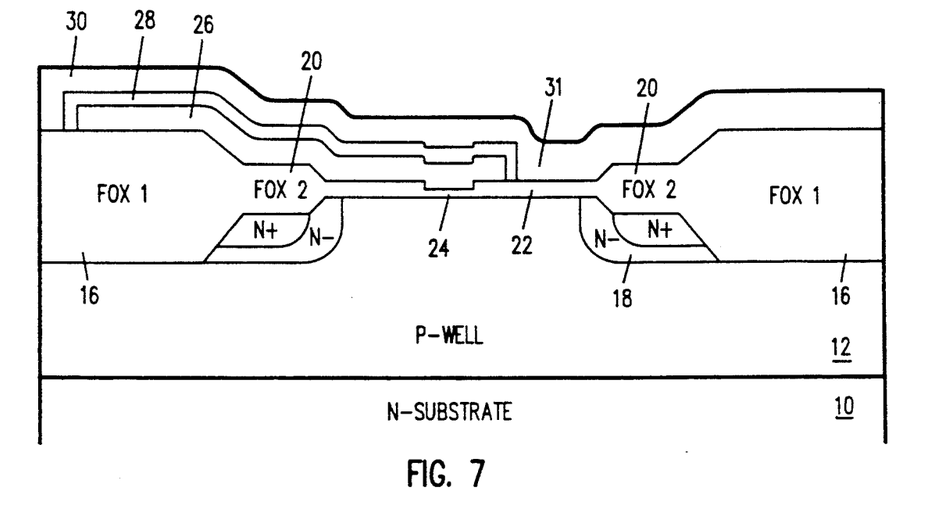
Figure 8:
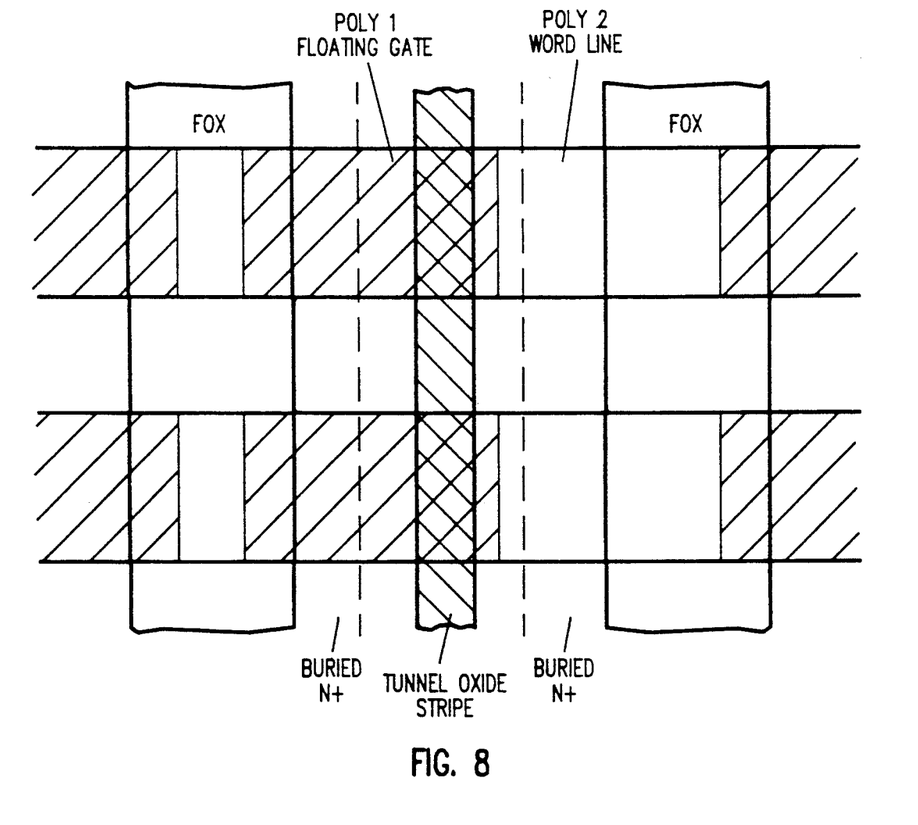
FIG. 8 is a layout illustrating the FIG. 7 cell structure.

A corresponding layout of the FIG. 7 cell is shown in FIG. 8, with the FIG. 7 cross section being taken along a word line in the FIG. 8 layout.

Referring back to FIG. 7, the poly1 floating gate 26 is truncated over the P-well region 12 between N+ buried bit lines 18. Thus, the overlying poly2 word line 20 forms an access gate transistor in a manner similar to the Shelton cell described above. However, because of the advantages provided by the processing techniques described above, the FIG. 9 cell is smaller than the Shelton cell and uses a poly2 access transistor gate rather than aluminum.

Figure 9:
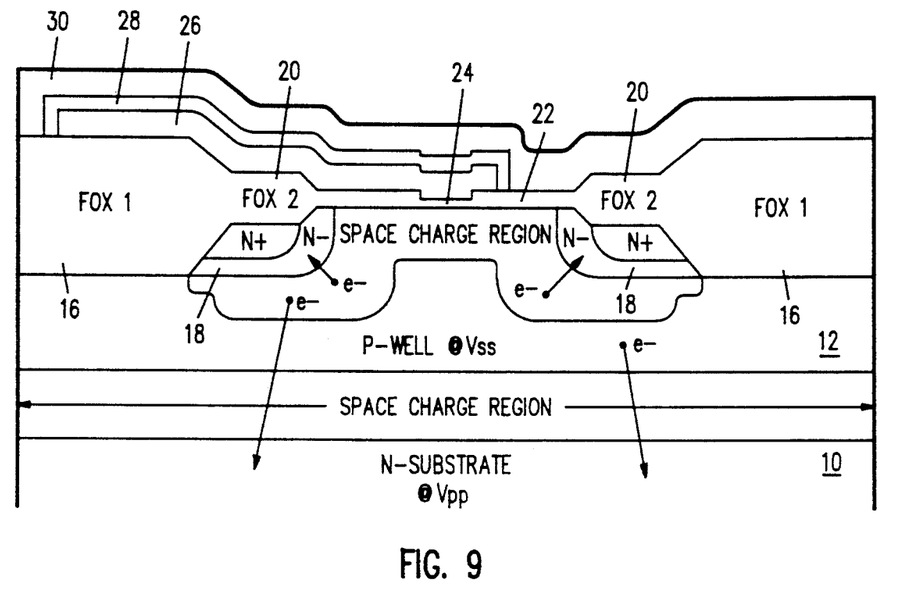

Table 1 provides a novel programming scheme for both the FIG. 7/8 cell. As shown in FIG. 9, the Table I programming scheme addresses deep depletion during program inhibit by causing any minority carriers (i.e. electrons) thermally generated in the P-well or in the space charge regions to be "sucked up" by the N−/P well and N+/N− bit line/P-well reversed bias junctions.

TABLE 1

|  | Source | Drain | Control Gate | P-Well | N-Sub |
|---|---|---|---|---|---|
| Write Program | $V_{ss}$ | $V_{ss}$ | $V_{pp}$ | $V_{ss}$ |  |
| WL Program Inhibit | $V_{pp}$ | $V_{pp}$ | $V_{pp}$ | $V_{ss}$ | $V_{pp}$ |
| BL Program Inhibit | $V_{ss}$ | $V_{ss}$ | $V_{ss}$ | $V_{ss}$ | $V_{pp}$ |
| Erase | $V_{pp}$ | $V_{pp}$ | $V_{ss}$ | $V_{pp}$ | $V_{pp}$ |
| BL Erase Inhibit | $V_{pp}$ | $V_{pp}$ | $V_{pp}$ | $V_{pp}$ | $V_{pp}$ |
| Read | $V_{ss}$ | $V_{read}$ | $V_{cc}$ | $V_{ss}$ | $V_{cc}$ |

More specifically, with reference to FIG. 10, the programming conditions are as follows. To program cell A, word line WL1 is held at the programming voltage $V_{pp}$. Bit line $BL_n$ and bit line $BL_n$, are held at the low supply voltage $V_{ss}$. The P-well is also held at $V_{ss}$. This creates an inversion layer of minority carriers in the channel, causing electrons to tunnel to the floating gate.

During this operation, cell C is program-inhibited by holding word line WL2 at $V_{ss}$, bit line $BL_n$ and $BL_n$, at $V_{ss}$ and the P-well at $V_{ss}$. Furthermore, cell B is program inhibited by holding wordline WL1 at $V_{pp}$ and raising bit line $BL_{n+1}$ and $BL_{n'+1}$ to the programming voltage, while the P-well is held at $V_{ss}$. This avoids the occurrence of any minority carriers at the P-well surface under the floating gate; the only minority carrier generation is thermal and all of these electrons are evacuated from the P-well by the N−/P-well and bit line/P-well reversed bias junctions.

Figure 10:
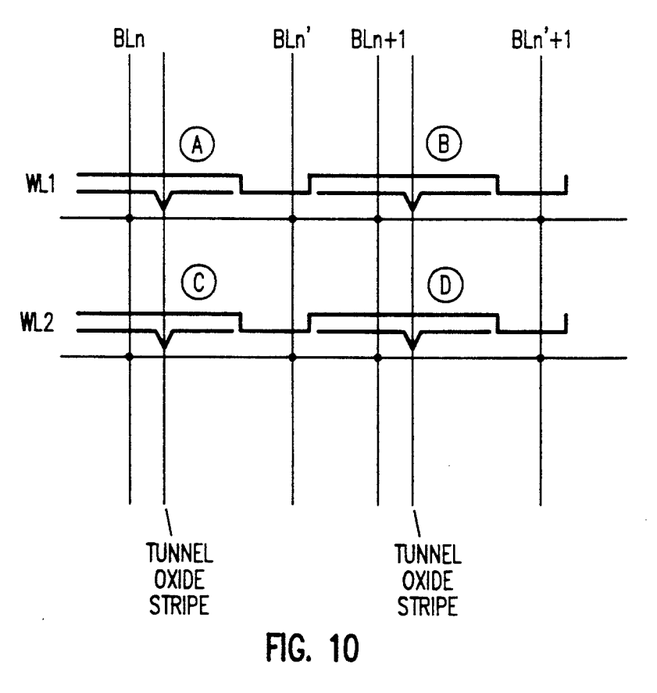

With continuing reference to FIG. 10, the erase conditions for the above-described storage cell are as follows. To erase cell A and its associated byte or word line, word line WL1 is held at $V_{ss}$ while bit lines $BL_N$ and $BL_{N}$, and $BL_{N+1}$ and $BL_{N'+1}$, as well as the P-well are held at the programming voltage Vpp. During this operation, cells C and D are erase inhibited by holding word line WL2 at the programming voltage.

It should be understood that various alternatives to the embodiments of the invention described herein may be employed in practicing the invention. It is intended that the following claims define the scope of the invention and that methods and structures within the scope of these claims and their equivalents be covered thereby.

What is claimed:

1. A method of fabricating an electrically-erasable programmable read only memory (EEPROM) cell formed in semiconductor material of P-type conductivity, the method comprising:

(a) forming first and second spaced-apart first field oxide (FOX1) regions in the P-type semiconductor material to define a P-type active device region therebetween;

(b) forming first and second spaced-apart bit lines of N-type conductivity in the P-type semiconductor material adjacent to the first and second FOX1 regions, respectively, such that the first and second bit lines define a P-type channel region therebetween;

(c) forming first and second spaced-apart second field oxide (FOX2) regions adjacent to the first and second FOX1 regions, respectively, and overlying the first and second bit lines, respectively;

(d) forming a layer of gate dielectric material on the P-type semiconductor material between the first and second FOX2 regions;

(e) defining a tunnel stripe in the gate dielectric material and growing tunnel dielectric material in the tunnel stripe such that the thickness of the tunnel dielectric stripe is less than the thickness of the gate dielectric material;

(f) forming a layer of first conductive material over the gate dielectric material and the dielectric tunnel stripe to define a floating gate of the EEPROM cell;

(g) forming a layer of intermediate dielectric material over the floating gate; and (h) forming a layer of second conductive material over the layer of intermediate dielectric material to define a control gate of the EEPROM cell, the dielectric tunnel stripe extending across a plurality of EEPROM cells sharing a first and second bit lines, the tunneling region of each such EEPROM cell being defined by the intersection of the dielectric tunnel stripe and the floating gate of each such EEPROM cell.

2. A method as in claim 1 wherein the layer of first conductive material is formed to extend over only a first portion of the P-type channel region such that the layer of second conductive material is formed directly on the gate dielectric material overlying a second portion of the channel region to thereby define the gate of an internal access transistor of the EEPROM cell.

3. A method as in claim 1 wherein the gate dielectric material and the tunnel dielectric material comprise silicon dioxide.

4. A method as in claim 3 wherein the first conductive material comprises polysilicon.

5. A method as in claim 4 wherein the intermediate dielectric material comprises an oxide/nitride/oxide composite.

6. A method as in claim 5 wherein the second conductive material comprises polysilicon.

7. A method as in claim 5 wherein the second conductive material comprises polysilicon and overlying tungsten silicide.

8. A method as in claim 1 wherein the P-type semiconductor material comprises a well of P-type conductivity formed in a silicon substrate of N-type conductivity.

9. An electrically-erasable programmable read only memory (EEPROM) cell formed in semiconductor material of P-type conductivity, the EEPROM cell comprising:
   (a) first and second spaced-apart first field oxide (FOX1) regions formed in the P-type semiconductor material to define a P-type active device region therebetween;
   (b) first and second space-apart bit lines of N-type conductivity formed in the P-type semiconductor material adjacent to the first and second FOX1 regions, respectively, such that the first and second bit lines define a P-type channel region therebetween;
   (c) first and second spaced-apart second field oxide (FOX2) regions formed adjacent to the first and second FOX1 regions, respectively, and overlying the first and second bit lines, respectively;
   (d) a layer of gate dielectric material formed on the P-type semiconductor material between the first and second FOX2 regions and having a dielectric tunnel stripe formed therein such that the thickness of the dielectric tunnel stripe is less than the thickness of the gate dielectric material;
   (e) a layer of first conductive material formed over the gate dielectric material and the dielectric tunnel stripe to define a floating gate of the EEPROM cell;
   (f) a layer of intermediate dielectric material formed over the floating gate; and
   (g) a layer of second conductive material formed over the intermediate dielectric material to define a control gate of the EEPROM cell,
   the dielectric tunnel stripe extending across a plurality of EEPROM cells sharing the first and second bit lines, a tunneling region of each such EEPROM cell being defined by the intersection of the dielectric tunnel stripe and the floating gate of each such EEPROM cell.

10. An EEPROM as in claim 9 wherein the layer of first conductive material extends over only a first portion of the P-type channel region such that the layer of second conductive material is formed directly on the gate dielectric material overlying a second portion of the channel region to thereby define the gate of an internal access transistor of the EEPROM cell.

11. An EEPROM cell as in claim 10 wherein the gate dielectric material and the tunnel dielectric stripe comprise silicon dioxide.

12. An EEPROM cell as in claim 11 wherein the first conductive material comprises polysilicon.

13. An EEPROM cell as in claim 12 wherein the intermediate dielectric material comprises oxide/nitride/oxide composite.

14. An EEPROM cell as in claim 13 wherein the second conductive material comprises polysilicon.

15. An EEPROM cell as in claim 13 wherein the second conductive material comprises polysilicon and overlying tungsten silicide.

16. An EEPROM cell as in claim 9 wherein the P-type semiconductor material comprises a well of P-type conductivity formed in a silicon substrate of N-type conductivity.

* * * * *